(12) United States Patent
Bottelli et al.

(10) Patent No.: US 7,996,736 B2
(45) Date of Patent: Aug. 9, 2011

(54) BAD PAGE MARKING STRATEGY FOR FAST READOUT IN MEMORY

(75) Inventors: Aldo Bottelli, Redwood City, CA (US); Luca Fasoli, Campbell, CA (US)

(73) Assignee: SanDisk 3D LLC, Milpitas, CA (US)

( * ) Notice: Subject to any disclaimer, the term of this patent is extended or adjusted under 35 U.S.C. 154(b) by 219 days.

(21) Appl. No.: 12/400,091

(22) Filed: Mar. 9, 2009

(65) Prior Publication Data

US 2010/0107022 A1    Apr. 29, 2010

Related U.S. Application Data

(60) Provisional application No. 61/108,524, filed on Oct. 26, 2008.

(51) Int. Cl.
*G11C 29/00* (2006.01)
*G06F 13/00* (2006.01)
*G06F 9/26* (2006.01)

(52) U.S. Cl. ........ 714/723; 714/737; 714/718; 714/710; 711/156; 711/206

(58) Field of Classification Search ................... 714/723, 714/737, 718, 710; 711/156, 206
See application file for complete search history.

(56) References Cited

U.S. PATENT DOCUMENTS

| | | | | |
|---|---|---|---|---|
| 5,758,056 A | * | 5/1998 | Barr | .................................. 714/7 |
| 5,915,167 A | | 6/1999 | Leedy | |
| 6,549,459 B2 | * | 4/2003 | Higuchi | .................... 365/185.09 |
| 6,813,678 B1 | * | 11/2004 | Sinclair et al. | ................. 711/103 |
| 6,826,081 B2 | * | 11/2004 | Nagashima et al. | ...... 365/185.09 |
| 6,845,438 B1 | * | 1/2005 | Tanaka et al. | .................. 711/206 |
| 6,895,490 B1 | * | 5/2005 | Moore et al. | ..................... 711/203 |
| 7,013,376 B2 | * | 3/2006 | Hooper, III | ..................... 711/202 |
| 7,142,471 B2 | * | 11/2006 | Fasoli et al. | .................... 365/200 |
| 7,171,536 B2 | * | 1/2007 | Chang et al. | ................... 711/170 |
| 7,366,825 B2 | * | 4/2008 | Williams et al. | ............... 711/103 |
| 7,423,904 B2 | | 9/2008 | Kojima | |
| 7,466,600 B2 | | 12/2008 | Roohparvar | |
| 7,472,331 B2 | | 12/2008 | Kim | |
| 2004/0210709 A1 | * | 10/2004 | Conley et al. | ................. 711/103 |
| 2006/0250836 A1 | | 11/2006 | Herner | |
| 2008/0294935 A1 | | 11/2008 | Ni et al. | |

OTHER PUBLICATIONS

Grosspietsch, Schemes of Dynamic Redundancy for Fault Tolerance in Random Access Memories, Aug. 1988, IEEE, vol. 37, No. 3. pp. 331-339.*

* cited by examiner

*Primary Examiner* — John J Tabone, Jr.
(74) *Attorney, Agent, or Firm* — Vierra Magen Marcus & DeNiro LLP

(57) ABSTRACT

A technique for identifying bad pages of storage elements in a memory device. A flag byte is provided for each page group of one or more pages which indicates whether the page group is healthy. Flag bytes of selected page groups also indicate whether larger sets of page groups are healthy, according to bit positions in the flag bytes. A bad page identification process includes reading the flag bytes with a selected granularity so that not all flag bytes are read. Optionally, a drill down process reads flag bytes for smaller sets of page groups when a larger set of page groups is identified as having at least one bad page. This allows the bad page groups to be identified and marked with greater specificity. Redundant copies of flag bytes may be stored in different locations of the memory device. A majority vote process assigns a value to each bit.

24 Claims, 8 Drawing Sheets

| flag byte, 212 | page group(0), 210 |
| flag byte, 222 | page group(1), 220 |
| flag byte, 232 | page group(2), 230 |
| flag byte, 242 | page group(3), 240 |

| B7 B6 B5 B4 B3 B2 B1 B0 | ← page group(0) |
| X X X X X X X B0 | ← page group(1) |
| X X X X X X B1 B0 | ← page group(2) |
| X X X X X X X B0 | ← page group(3) |
| X X X X X B2 B1 B0 | ← page group(4) |
| X X X X X X X B0 | ← page group(5) |
| X X X X X X B1 B0 | ← page group(6) |
| X X X X X X X B0 | ← page group(7) |
| X X X X B3 B2 B1 B0 | ← page group(8) |
| X X X X X X X B0 | ← page group(9) |
| X X X X X X B1 B0 | ← page group(10) |
| X X X X X X X B0 | ← page group(11) |
| X X X X X B2 B1 B0 | ← page group(12) |
| X X X X X X X B0 | ← page group(13) |
| X X X X X X B1 B0 | ← page group(14) |
| X X X X X X X B0 | ← page group(15) |
| X X X B4 B3 B2 B1 B0 | ← page group(16) |
| X X X X X X X B0 | ← page group(17) |
| X X X X X X B1 B0 | ← page group(18) |
| X X X X X X X B0 | ← page group(19) |
| X X X X X B2 B1 B0 | ← page group(20) |
| X X X X X X X B0 | ← page group(21) |
| X X X X X X B1 B0 | ← page group(22) |
| X X X X X X X B0 | ← page group(23) |
| X X X X B3 B2 B1 B0 | ← page group(24) |
| X X X X X X X B0 | ← page group(25) |
| X X X X X X B1 B0 | ← page group(26) |
| X X X X X X X B0 | ← page group(27) |
| X X X X X B2 B1 B0 | ← page group(28) |
| X X X X X X X B0 | ← page group(29) |
| X X X X X X B1 B0 | ← page group(30) |
| X X X X X X X B0 | ← page group(31) |

BAD PAGE MARKING STRATEGY FOR FAST READOUT IN MEMORY

CROSS-REFERENCE TO RELATED APPLICATIONS

This application claims the benefit of U.S. provisional patent application No. 61/108,524, filed Oct. 26, 2008, incorporated herein by reference.

BACKGROUND

The present invention relates to technology for data storage.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Non-volatile memories formed from reversible resistance-switching elements are also known. For example, U.S. Patent Application Publication 2006/0250836, published Nov. 9, 2006, and titled "Rewriteable Memory Cell Comprising A Diode And A Resistance-Switching Material," incorporated herein by reference, describes a rewriteable non-volatile memory cell that includes a diode coupled in series with a reversible resistance-switching material such as a metal oxide or metal nitride. These reversible resistance-switching materials are of interest for use in nonvolatile memory arrays. One resistance state may correspond to a data "0," for example, while the other resistance state corresponds to a data "1." Some of these materials may have more than two stable resistance states.

Moreover, various types of volatile memory devices are known, such as DRAM. Further, memory devices can have one layer of storage elements, or multiple layers in so-called 3d memory devices.

For purposes of storing and reading data, a memory device can be structured in units called pages. Each memory device is typically tested before being shipped to the end user to identify bad pages which are not suitable for storing data because of the presence of some defect. Due to manufacturing variations, a number of such bad pages are inevitably identified. Each bad page can be marked to prevent access to it. Typically, an overhead data region of each page can include a flag which identifies the health of the page as being good or bad. In the possession of the end user, when the memory device is powered on, or at other specified times, a controller of the memory device can read each flag to determine whether the associated page is usable. The controller can decide to ignore each bad page, and/or to provide a redundant page in its place. However, a memory device can contain millions of pages, so reading out the information about the health of each page can be unduly time consuming, thus impacting the performance of the memory device.

Techniques are needed for faster readout of bad page data in a memory device.

SUMMARY

A technique for operating a memory device is provided which uses a hierarchical bad page marking strategy for faster readout.

In one embodiment, a method is provided for operating a memory device which includes storage elements arranged in units. The method includes identifying units of storage elements of the memory device which are to be treated as being faulty based on flag bytes stored in the memory device, where: (a) the units are arranged according to a hierarchy having at least three levels, from smallest units at a lowest level of the hierarchy to largest units at a highest level of the hierarchy, and (b) different bit positions of the flag bytes are associated with different levels of the hierarchy to indicate whether units of storage elements of the different levels include at least one faulty storage element. The identifying includes reading initially selected ones of the flag bytes according to an initially selected level of the hierarchy, and evaluating bits of the initially selected flag bytes whose bit position corresponds to the initially selected level of the hierarchy. The method further includes, based on the identifying, preparing a map which indicates units of storage elements of the memory device which are to be treated as being faulty.

In one embodiment, a method is provided for operating a memory device which includes storage elements arranged in units. The method includes identifying units of storage elements of the memory device which are to be treated as being faulty based on selected redundant flag bytes stored in the memory device, where each selected redundant flag byte has a bit which indicates whether an associated unit of storage elements includes at least one faulty storage element, and at least two of the selected redundant flag bytes are stored in different memory arrays of the memory device. The identifying includes reading the selected redundant flag bytes, and determining whether the associated unit of storage elements includes at least one faulty storage element by determining whether a bit in a specified bit position of the selected redundant flag bytes is a 0 or 1 more often in the redundant flag bytes. The method further includes, based on the identifying, preparing a map which indicates units of storage elements of the memory device which are to be treated as being faulty.

In one embodiment, a method is provided for operating a memory device which includes storage elements arranged in units. The method includes testing units of storage elements to identify units which include at least one faulty storage element. The method further includes, based on the testing, writing flag bytes to the memory device, where the flag bytes indicate whether units of storage elements are to be treated as being faulty. Furthermore, (a) the units are arranged according to a hierarchy having at least three levels, from smallest units at a lowest level of the hierarchy to largest units at a highest level of the hierarchy, and (b) different bit positions of the flag bytes are associated with different levels of the hierarchy to indicate whether units of storage elements of the different levels include at least one faulty storage element.

In another embodiment, a non-volatile storage includes a set of non-volatile storage elements which is formed on a substrate and one or more control circuits. The one or more control circuits identify units of storage elements of the memory device which are to be treated as being faulty based on flag bytes stored in the memory device, where: (a) the units are arranged according to a hierarchy having at least three levels, from smallest units at a lowest level of the hierarchy to largest units at a highest level of the hierarchy, and (b) different bit positions of the flag bytes are associated with different levels of the hierarchy to indicate whether units of storage elements of the different levels include at least one faulty storage element. The one or more control circuits perform the identifying by reading initially selected ones of the flag bytes according to an initially selected level of the hierarchy, and evaluating bits of the initially selected flag bytes whose bit position corresponds to the initially selected level of the hierarchy. The one or more control circuits, based on the identifying, prepare a map which indicates units of storage elements of the memory device which are to be treated as being faulty.

Corresponding methods, systems and computer- or processor-readable storage devices which have executable code for performing the methods provided herein may also be provided.

BRIEF DESCRIPTION OF THE DRAWINGS

FIG. 4 depicts example values of successive flag bytes.

DETAILED DESCRIPTION

A technique for operating a memory device is provided which uses a hierarchical bad page marking strategy for faster readout.

Figure 1:
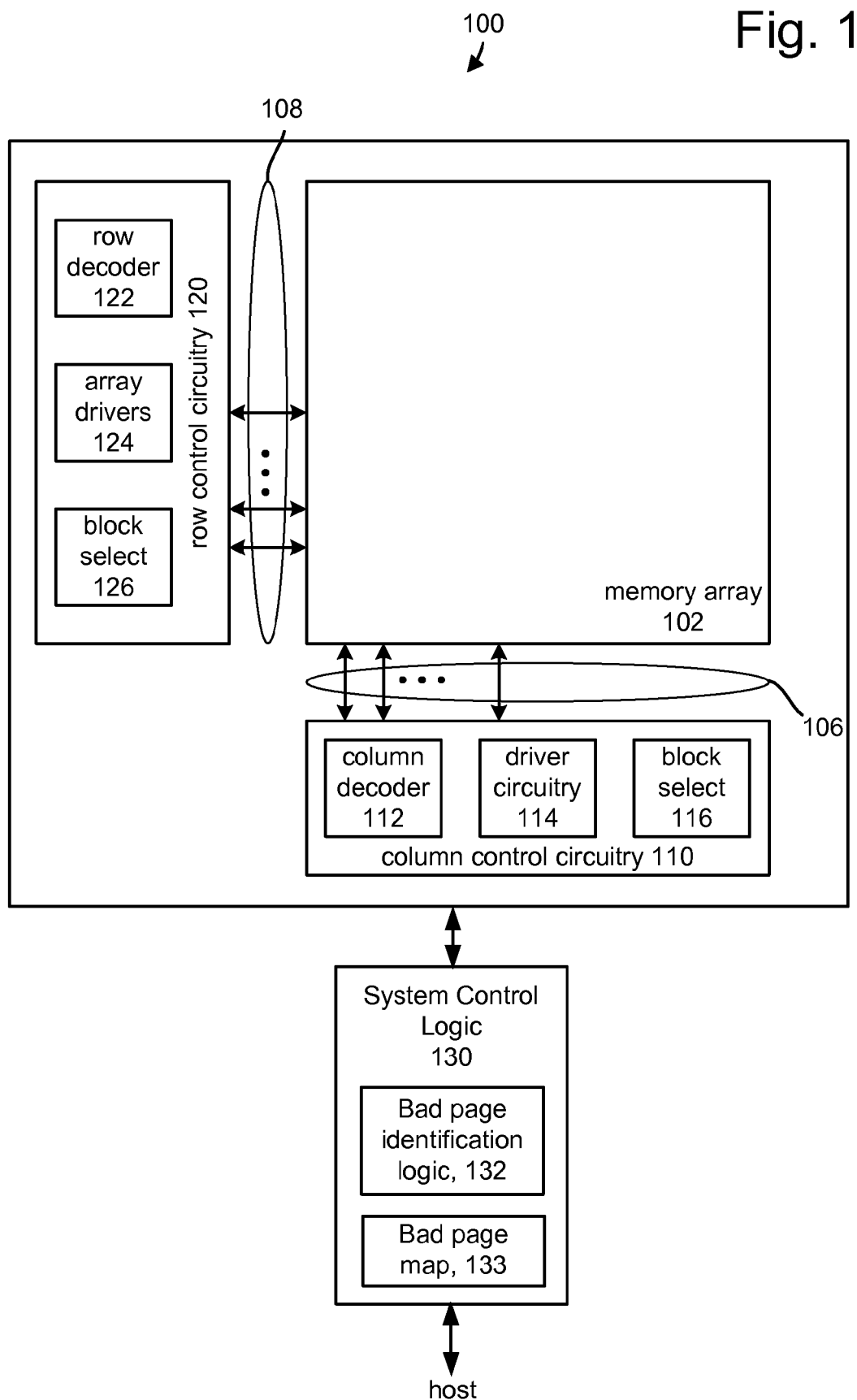
FIG. 1 is a block diagram of one embodiment of a memory system.

FIG. 1 is a block diagram that depicts one example of a memory system 100 that can implement the technology described herein. Memory system 100 includes a memory array 102 that can be a two or three dimensional array of memory cells. In one implementation, memory array 102 is a monolithic three dimensional memory array. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

In another possible implementation, the memory array is a two-dimensional array of non-volatile storage elements which are series connected in strings, column-wise, such as NAND strings. Each string extends between drain- and source-side select gates. Word lines communicate with control gates of the storage elements in a row. Bit lines communicate with the drain end of each string, and sensing components are coupled to the bit lines to determine whether a selected storage element is in a conductive or non-conductive state.

The array terminal lines of memory array 102 include the various layer(s) of word lines organized as rows, and the various layer(s) of bit lines organized as columns. However, other orientations can also be implemented.

Memory system 100 includes row control circuitry 120, whose outputs 108 are connected to respective word lines of the memory array 102. Row control circuitry 120 receives a group of M row address signals and one or more various control signals from system control logic circuit 130, and typically may include such circuits as row decoders 122, array terminal drivers 124, and block select circuitry 126 for both read and programming operations. Memory system 100 also includes column control circuitry 110 whose input/outputs 106 are connected to respective bit lines of the memory array 102. Column control circuitry 110 receives a group of N column address signals and one or more various control signals from system control logic 130, and typically may include such circuits as column decoders 112, array terminal receivers or drivers 114, block select circuitry 116, as well as read/write circuitry, and I/O multiplexers. System control logic 130 receives data and commands from a host and provides output data to the host. In other embodiments, system control logic 130 receives data and commands from a separate controller circuit and provides output data to that controller circuit, with the controller circuit communicating with the host. System control logic 130 may include one or more state machines, registers and other control logic for controlling the operation of the memory system 100 as described herein.

In one embodiment, all of the components depicted in FIG. 1 are arranged on a single integrated circuit. For example, system control logic 130, column control circuitry 110 and row control circuitry 120 are formed on the surface of a substrate. Moreover, memory array 102 can be a monolithic three dimensional memory array formed above the substrate (and, therefore, above system control logic 130, column control circuitry 110 and row control circuitry 120). In some cases, a portion of the control circuitry can be formed on the same layers as some of the memory array.

Integrated circuits incorporating a memory array usually subdivide the array into a number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Further, greater reliability can be achieved by storing data redundantly in different sub-arrays, so that if a defect such as a break in a word line occurs in one sub-array, it will not affect another sub-array whose word line is a different conductive path. Moreover, different voltage drivers and other peripheral components can be provided for the different sub-arrays, again to improve reliability.

Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more memory arrays.

The system control logic 130 may include bad page identification logic 132, and a bad page map 133 which is stored in a volatile memory such as RAM. As mentioned at the outset, for purposes of storing and reading data, a memory device can be structured in units called pages. For example, the memory array 102 can be structured into many pages of data. During the manufacturing and die sort process, the pages of storage elements are tested. Bad pages are identified and marked by one or more flag bytes which are typically stored in storage elements that are contiguous with storage elements in which the associated page of user data is meant to be stored. For example, the flag byte and page may be stored on a common word line in an array. The system control logic 130 and any of the other components, besides the memory array 102, may be considered to be control circuits.

Figures 2, 3:
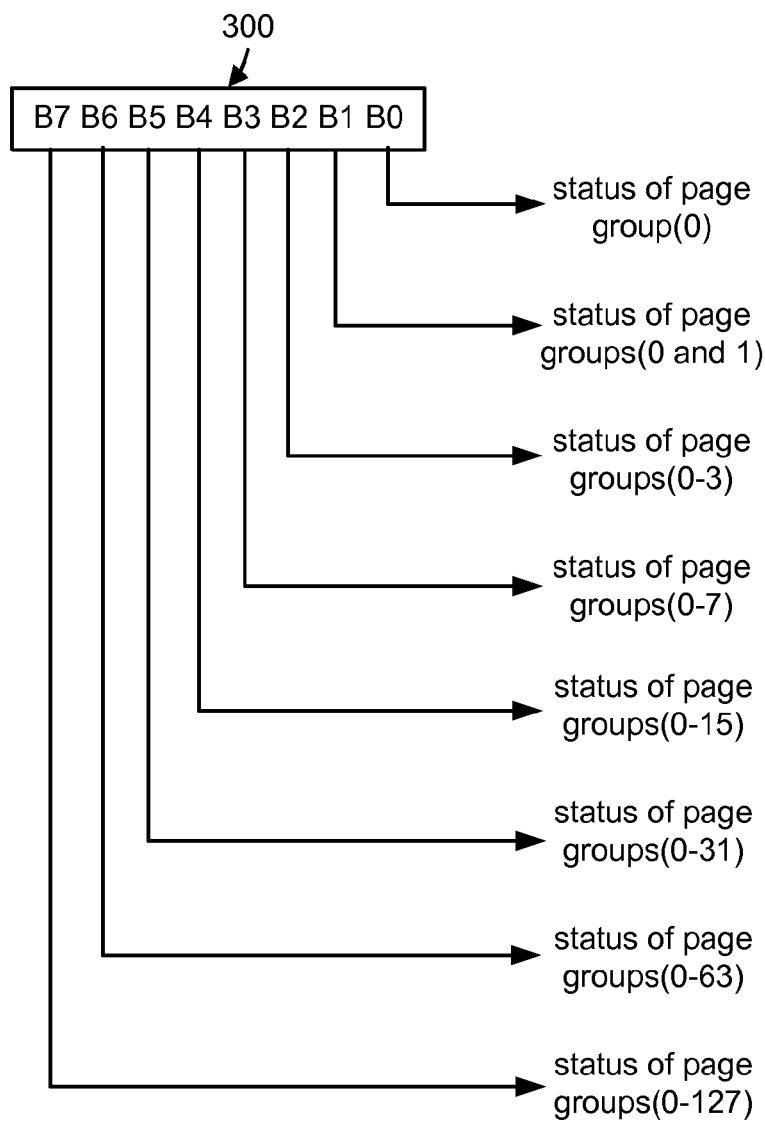
FIG. 2 depicts flag bytes and associated page groups.
FIG. 3 depicts an assignment of different bit positions in a flag byte to different units of page groups, in a hierarchy.

FIG. 2 depicts example flag bytes and associated page groups. A page group refers to one or more pages of storage elements, where a page is a smallest unit of storage elements which can be read or written at a time. Depending on the number of pages in a memory device, it may be desirable to group a number of pages, such as 16 or 32 pages, into a page group. Example page group(0) 210 has an associated flag byte 212, page group(1) 220 has an associated flag byte 222, page group(2) 230 has an associated flag byte 232, page group(3) 240 has an associated flag byte 242, and so on. Each flag byte may be store contiguously with the page group in a word line.

FIG. 3 depicts an assignment of different bit positions in a flag byte to different units of page groups, in a hierarchy. An example flag byte 300 includes eight bits B0-B7, where B0 is the least significant bit and B7 is the most significant bit. Bit 0 (B0) is assigned to represent a status of one page group, such as page group(0), so that if B0=0, for instance, the page group is bad, that is, it has been identified as having at least one faulty storage element and should be treated as being faulty. If B0=1, the page group is good, that is, it has not been identified as having at least one faulty storage element and should not be treated as being faulty. Alternatively, the roles of the 0 and 1 bit values could be reversed.

Bit 1 (B1) is assigned to represent a status of, e.g., a set of two page groups, such as page groups(0 and 1). If B1=0, the set is bad, that is, it has been identified as having at least one faulty storage element in at least one of its page groups and should be treated as being faulty. If B1=1, the set is good, that is, it has not been identified as having any faulty storage elements and should not be treated as being faulty.

The assignment of the bits proceeds accordingly, with each more significant bit representing a larger set of page groups, in progressive binary manner such that B0, B1, B2, B3, B4, B6, B6 and B7 represent $2^0=1$, $2^1=2$, $2^2=4$, $2^3=8$, $2^4=16$, $2^5=32$, $2^6=64$ and $2^7=128$ page groups, respectively, in one possible implementation.

For example, Bit 2 (B2) is assigned to represent a status of, e.g., a set of four page groups, such as page groups(0-3). If B2=0, the set is bad, and if B2=1, the set is good. Bit 3 (B3) is assigned to represent a status of, e.g., a set of eight page groups, such as page groups(0-7). If B3=0, the set is bad, and if B3=1, the set is good. Bit 4 (B4) is assigned to represent a status of, e.g., a set of sixteen page groups, such as page groups(0-15). If B4=0, the set is bad, and if B4=1, the set is good. Bit 5 (B5) is assigned to represent a status of, e.g., a set of thirty-two groups, such as page groups(0-31). If B5=0, the set is bad, and if B5=1, the set is good. Bit 6 (B6) is assigned to represent a status of, e.g., a set of sixty-four page groups, such as page groups(0-63). If B6=0, the set is bad, and if B6=1, the set is good. Bit 7 (B7) is assigned to represent a status of, e.g., a set of one hundred and twenty eight page groups, such as page groups(0-127). If B6=0, the set is bad, and if B6=1, the set is good.

Note that the example here could alternatively assign pages groups to the bits in a reverse order, from most significant bit to least significant bit. Further, it is possible to assign bits in more than one byte and/or to assign more than one bit to each set of one or more page groups.

Note that one or more pages or page groups may be considered to be a unit of storage elements, so that different sized units of storage elements are associated with the different bit positions in different levels of a hierarchy.

FIG. 4 depicts example values of successive flag bytes. Using the above-mentioned bit assignment technique, for each flag byte, one or more of the bits will have assigned values, while other bits may not have assigned values, and are referred to as "don't care" bits (represented by an X in FIG. 4). A "don't care" bit can have a 0 or 1 value. For example, B0 of each flag byte will indicate whether the associated page group is good or bad, for each of the page groups(0-31). However, B1 is used only for every second flag byte, e.g., for page groups(0, 2, 4, 6, 8, 10, 12, 14, 16, 18, 20, 22, 24, 26, 28 and 30). B2 is used only for every fourth flag byte, e.g., for page groups(0, 4, 8, 12, 16, 20, 24 and 28). B3 is used only for every eighth flag byte, e.g., for page groups(0, 8, 16 and 24). B4 is used only for every sixteenth flag byte, e.g., for page groups(0 and 16). B5 is used only for every thirty-second flag byte, e.g., for page group(0). Additional, more significant bits may be used for additional sets of page groups which are not depicted.

Thus, selected flag bytes contain health information regarding multiple sets or units of page groups, as follows for page groups(0-16), as an example:

| Flag byte for page group: | Contains health information for page groups: |
|---|---|
| 0 | 0-127 |
| 2 | 2 and 3 |
| 4 | 4-7 |
| 6 | 6 and 7 |
| 8 | 8-15 |
| 10 | 10 and 11 |
| 12 | 12-15 |
| 14 | 14 and 15 |
| 16 | 16-31 |

Other flag bytes need only contain health information for their own page group. These include flag bytes for page groups(1, 3, 5, 7, 9, 11, 13, 15, 17, 19, 21, 23, 25, 27, 29 and 31).

Figure 5:
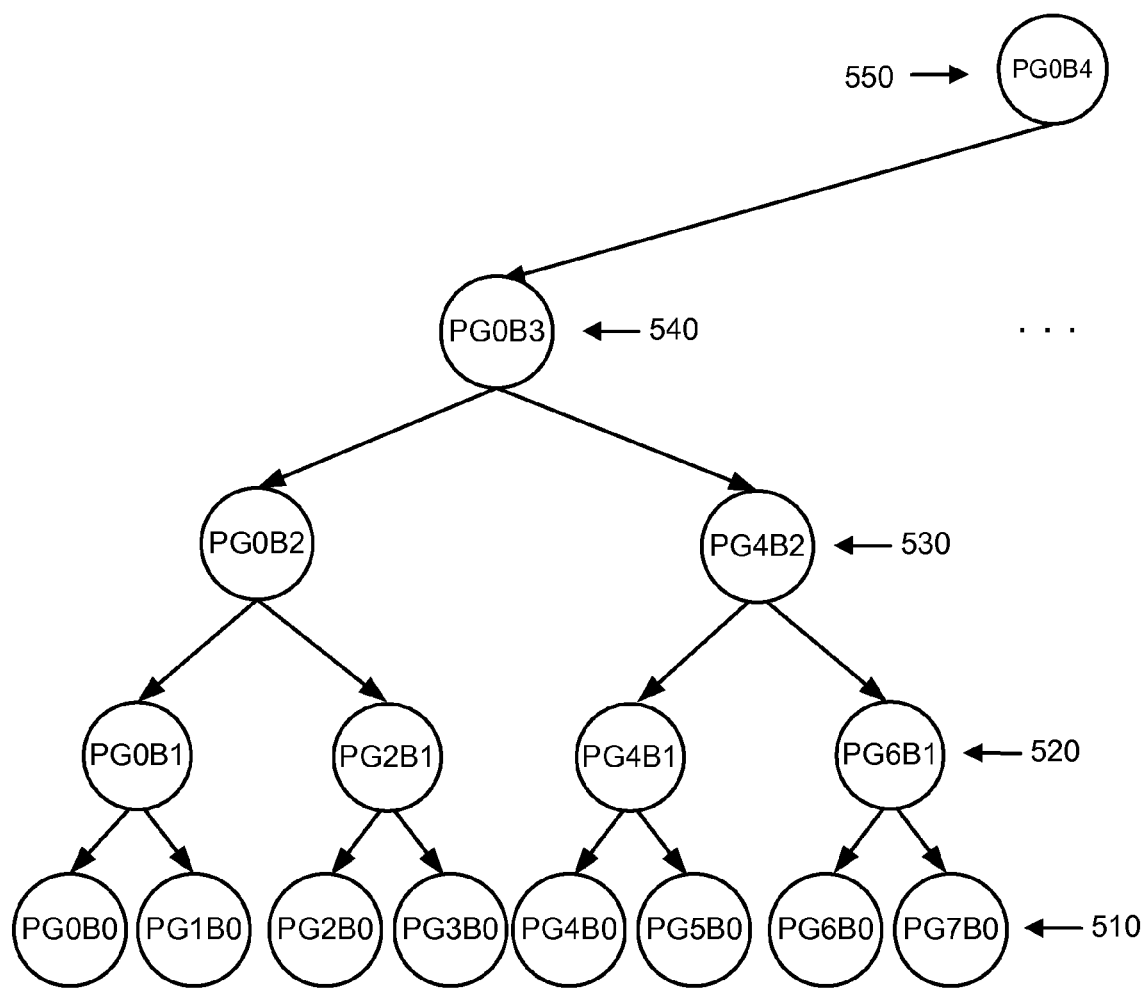
FIG. 5 depicts a hierarchical arrangement of bits in flag bytes.

FIG. 5 depicts a hierarchical arrangement of bits in flag bytes. Each bit position in a flag byte can be considered to correspond to a level of a hierarchy, where bit 0 (B0) is at the lowest level and bit 7 (B7) is at the highest level. However, it is not necessary to use all seven bits. A portion of a tree is depicted which represents a hierarchy which corresponds to the example of FIG. 4. A lowest level of the hierarchy 510 includes a number of nodes which represent B0 for each page group (PG), including page group(0), B0 (PG0B0), page group(1), B0 (PG1B0), page group(2), B0 (PG2B0), page group(3), B0 (PG3B0), page group(4), B0 (PG4B0), page group(5), B0 (PG5B0), page group(6), B0 (PG6B0) and page group(7), B0 (PG7B0).

A next level of the hierarchy 520 includes a number of nodes which represent B1 for the sets of page groups for which B1 has a meaning. This includes page group(0), B1 (PG0B1), page group(2), B1 (PG2B1), page group(4), B1 (PG4B1) and page group(6), B1 (PG6B1).

A next level of the hierarchy 530 includes nodes which represent B2 for the sets of page groups for which B2 has a meaning. This includes page group(0), B2 (PG0B2), page group(4), B2 (PG4B2).

A next level of the hierarchy 540 includes a node which represents B3 for the sets of page groups for which B3 has a meaning. This includes page group(0), B3 (PG0B3).

A next level of the hierarchy 550 includes a node which represents B4 for the sets of page groups for which B4 has a meaning. This includes page group(0), B4 (PG0B4).

Additional levels of the hierarchy may be used. Further, the entire tree is not shown, including a portion which would extend to the right hand side.

Each node has a value of 0 or 1 depending on the value of the bit which is represented by the node. For any particular node, if any nodes under the particular node have a bit value=0, indicating a fault, the particular node will also have a bit value=0. If all nodes under the particular node have a bit value=1, indicating no faults, the particular node will also have a bit value=1. For example, if any of the nodes under PG0B4 has a bit value=0, then PG0B4 also has a bit value=0. As another example, if PG0B0=0 and PG1B0=1, then PG0B1=0. If PG0B0=1 and PG1B0=1, then PG0B1=1.

Note that the hierarchical structure of the pages can be binary (base 2), as in the above examples, or it can follow any other base. As an example, if the structure requires it (having, for example, three pages per row), one could choose a base 3 in the organization of the hierarchy of the page groups, at least for a portion of the hierarchy. Or, for example, one could choose a base 4, if with the same number of bits in the flag byte we want to have a larger page group size in the hierarchy.

Figure 6:
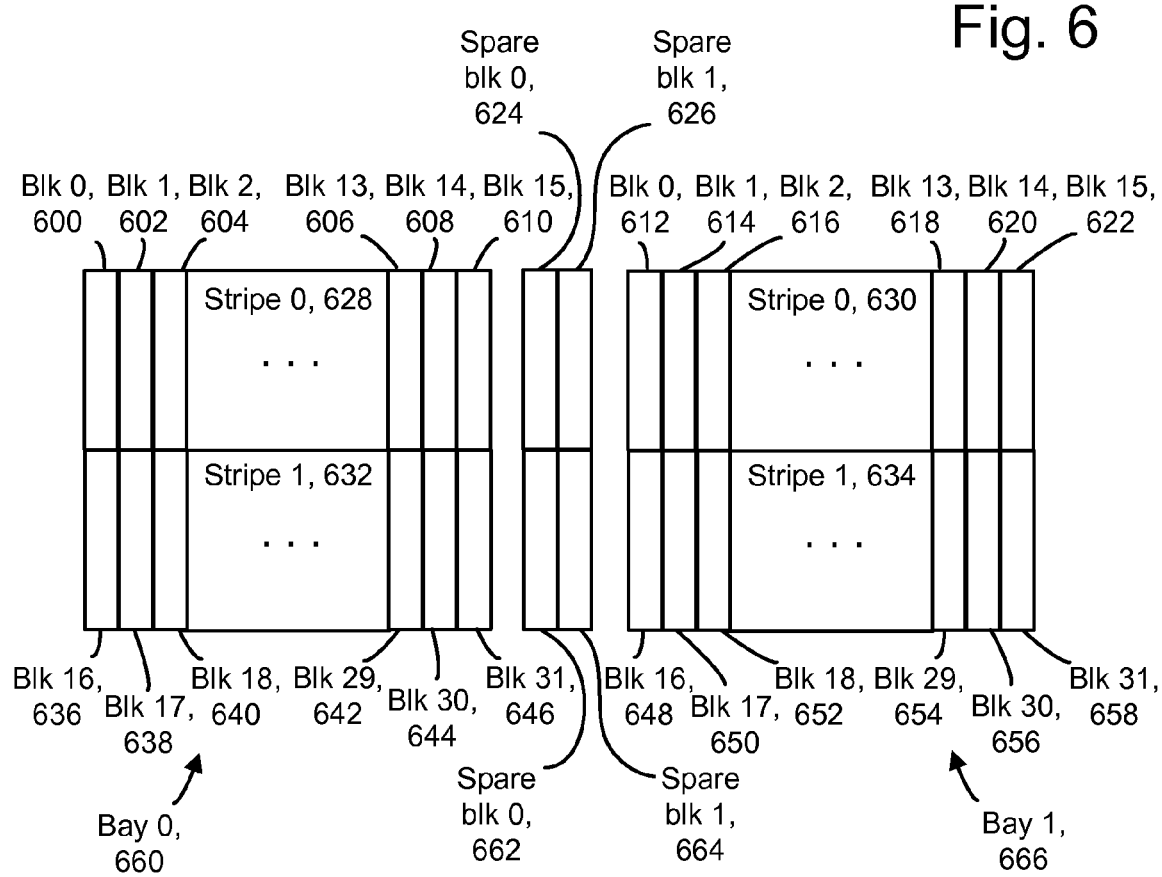
FIG. 6 depicts a set of two bays of storage elements.

FIG. 6 depicts a set of two bays of storage elements. The storage elements in a memory device can be organized in different sets or units. In one possible approach, the storage elements are organized into a number of bays, such as 16, 32 or 64 bays, where each bay includes, e.g., 32 blocks. Further, the blocks may be arranged in, e.g., two rows or stripes of 16 blocks each. Each block includes many pages, and each page includes, e.g., 2056 bytes, including eight bytes for the flag data and other meta data, in one possible implementation. Additionally, spare blocks may be provided which can be used by neighboring bays. Each bay may be considered to have an array of storage elements.

For example, a bay 0 (660) and a bay 1 (666) are depicted. Bay 0 includes a stripe 0 (628) and a stripe 1 (632). Stripe 0 includes blocks 0-15, including block (Blk) 0 (600), Blk 1 (602), Blk 2 (604), . . . , Blk 13 (606), Blk 14 (608) and Blk 15 (610). Stripe 1 includes blocks 16-31, including Blk 16 (636), Blk 17 (638), Blk 18 (640), . . . , Blk 29 (642), Blk 30 (644) and Blk 31 (646). Similarly, bay 1 (666) includes a stripe 0 (630) and a stripe 1 (634). Stripe 0 includes blocks 0-15, including Blk 0 (612), Blk 1 (614), Blk 2 (616), . . . , Blk 13 (618), Blk 14 (620) and Blk 15 (622). Stripe 1 includes blocks 16-31, including Blk 16 (648), Blk 17 (650), Blk 18 (652), . . . , Blk 29 (654), Blk 30 (656) and Blk 31 (658).

Spare block 0 (624) and spare block 1 (626) can be connected to either stripe 0 (628) or stripe 0 (630) as redundant blocks. Spare block 0 (662) and spare block 1 (664) can be connected to either stripe 1 (632) or stripe 1 (634) as redundant blocks.

Figure 7:
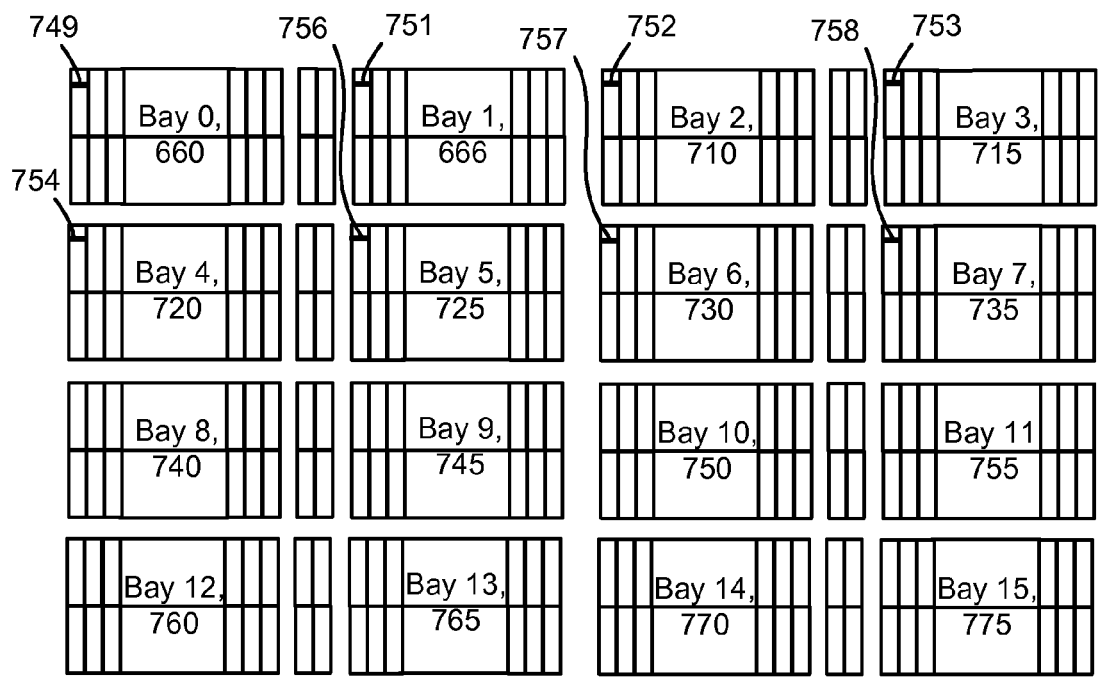
FIG. 7 depicts a set of sixteen bays of storage elements.

FIG. 7 depicts a set of sixteen bays of storage elements in a memory device. Specifically, bay 0 (660) and bay 1 (666) from FIG. 6 are provided, in addition to bay 2 (710), bay 3 (715), bay 4 (720), bay 5 (725), bay 6 (730), bay 7 (735), bay 8 (740), bay 9 (745), bay 10 (750), bay 11 (755), bay 12 (760), bay 13 (765), bay 14 (770) and bay 15 (775).

Word lines which are associated with storage elements extend in horizontal rows across the bays. Typically, a common range of word line numbers is used for each stripe or bay. However, different physical conductive lines of the word lines are arranged in the different bays. In one approach, discussed further below in connection with FIGS. 10 and 11, flag bytes can be stored redundantly in different physical word lines which optionally have the same word line number. For example, copies of a flag byte can be stored on an example word line 749 in bay 0 (660), word line 751 in bay 1 (666), word line 752 in bay 2 (710), word line 753 in bay 3 (715), word line 754 in bay 4 (720), word line 756 in bay 5 (725), word line 757 in bay 6 (730), word line 758 in bay 7 (735).

Moreover, in the memory device configuration of FIG. 7, when a particular block is accessed, the like-numbered blocks in each of the bays is accessed. For example, accessing block 0 includes accessing block 0 (600) (see also FIG. 6) in bay 0 (660), block 0 (612) in bay 1 (666), block 0 in bay 2, and so forth. In this way, a page group can be separated in different locations. This gives the advantage of using different physical word lines.

Figure 8:
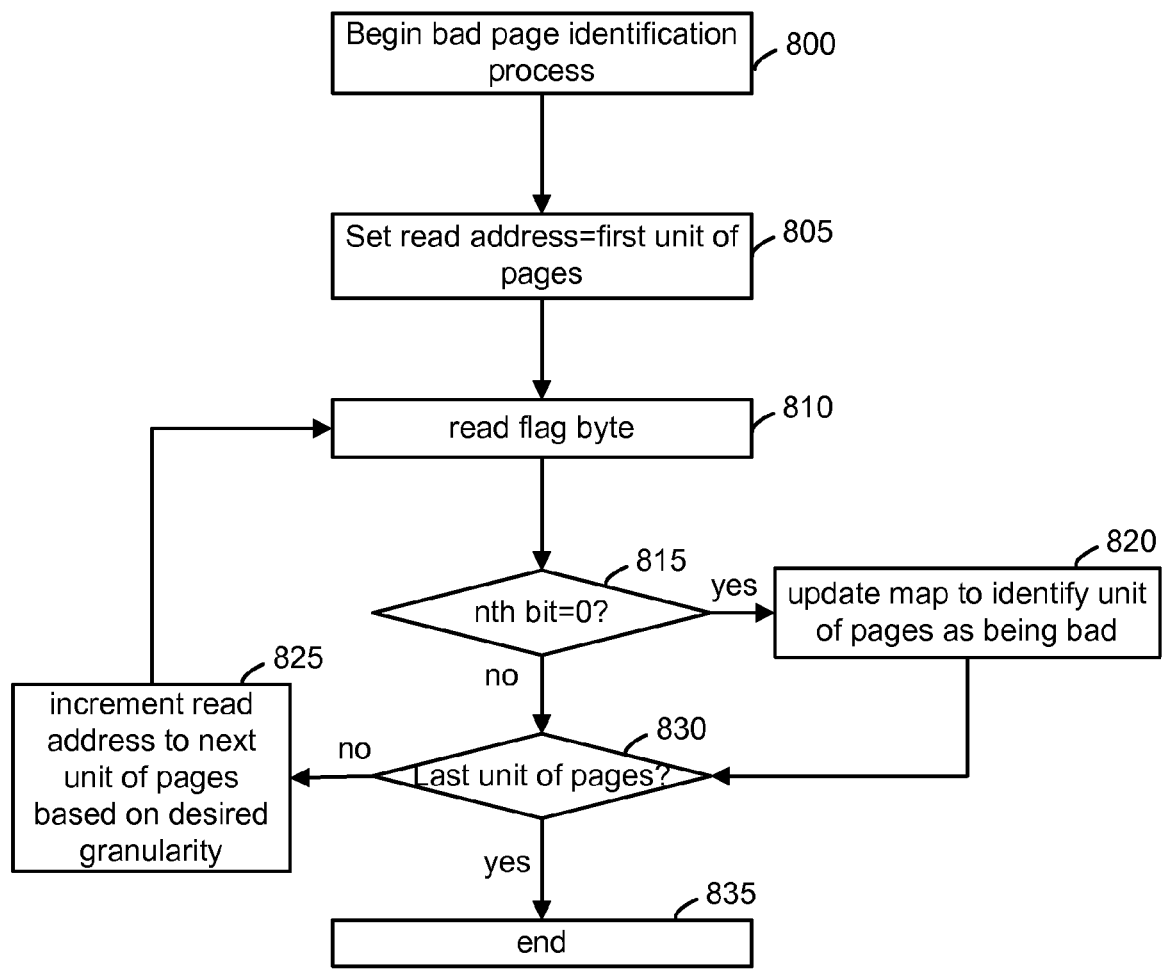
FIG. 8 depicts a process for identifying bad pages with a selected granularity.

FIG. 8 depicts a process for identifying bad pages with a selected granularity. By assigning different bits of the flag bytes to different units of pages, it is possible to identify bad pages in a memory device with a desired level of granularity. In an approach which uses a coarse granularity, relatively few flag bytes are examined to determine whether the associated pages include a faulty page. This avoids the need to check every flag byte in the memory device. Each unit of pages can be marked as being faulty, if necessary, in a map in a working memory of the memory device (see, e.g., map 133 in FIG. 1). The map can include any type of appropriate data structure. For example, the map can include a range of addresses of the pages which are faulty. The map can be populated when the memory device is powered on, for instance. Units of pages which are determined to be not faulty can be excluded from the map, in one possible approach. Or, the map can identify the addresses of the good pages with an indication that they are good. Typically, fewer page groups are bad than good, so it is more space efficient to only identify the bad page groups. Once the map is developed, when an operation such as write operation is performed, the map is accessed to determine whether a unit of pages is bad. If a unit of pages has been marked as being bad, it is not used to store data.

The coarse granularity approach has the advantage that it is relatively fast, as relatively fewer flag bytes needed to be read. Each read operation consumes time. As a result, the memory device can be made ready more quickly for user operations. A disadvantage is that a larger group of pages is marked as being bad even when only a small number of the pages are actually bad.

In an approach which uses a fine granularity, relatively many flag bytes are examined to determine whether the associated page groups include a faulty page. In the finest granularity, each flag byte is read. The fine granularity approach has the disadvantage that it is relatively more time consuming as more flag bytes needed to be read. An advantage is it avoids marking large groups of pages as being bad even when only a small number of the pages are actually bad.

An example bad page identification process begins at step 800. At step 805, a controller of the memory device sets a read address equal to an address of a first unit of pages. For example, this could be the address of page group(0) (FIG. 4). At step 810, the flag byte of the unit is read. At decision step 815, a determination is made as to whether the nth bit=0, indicating that the unit includes at least one faulty page and therefore the entire unit should be treated as being faulty. Note that the particular nth bit which is evaluated is based on the desired level of granularity, which corresponds to a level in the bit hierarchy. A more significant bit will be accessed for a lower granularity, at a higher level in the hierarchy, and a less significant bit will be accessed for a higher granularity, at a lower level in the hierarchy. A memory device may be configured at the time of manufacture to use a certain level of granularity, in one possible approach, or the granularity can be set when the memory device is in the end user's possession. It is also possible for the granularity to change at different times. For example, in FIG. 4, assume that the desired granularity is every eight page groups, so that the nth bit is the fourth bit, B3.

If the nth bit=0, indicating a fault, the map is updated to identify the unit of pages as being bad, at step 820. If the nth bit=1, indicating no faults, a determination is made at decision step 830 as to whether the last unit of pages has been reached. If the last unit of pages has been reached, the process ends at step 835. If the last unit of pages has not been reached, the read address is incremented to the next unit of pages based on the desired granularity, at step 825. With the example granularity of every eight page groups, the address is incremented to the address of page group(8). At step 810, the flag byte of the new unit of pages is read, and the processing proceeds as discussed so that the map is updated to identify any units of pages which are bad. Once all flag bytes which correspond to the desired granularity have been read and examined, the process ends at step 835.

Figure 9:
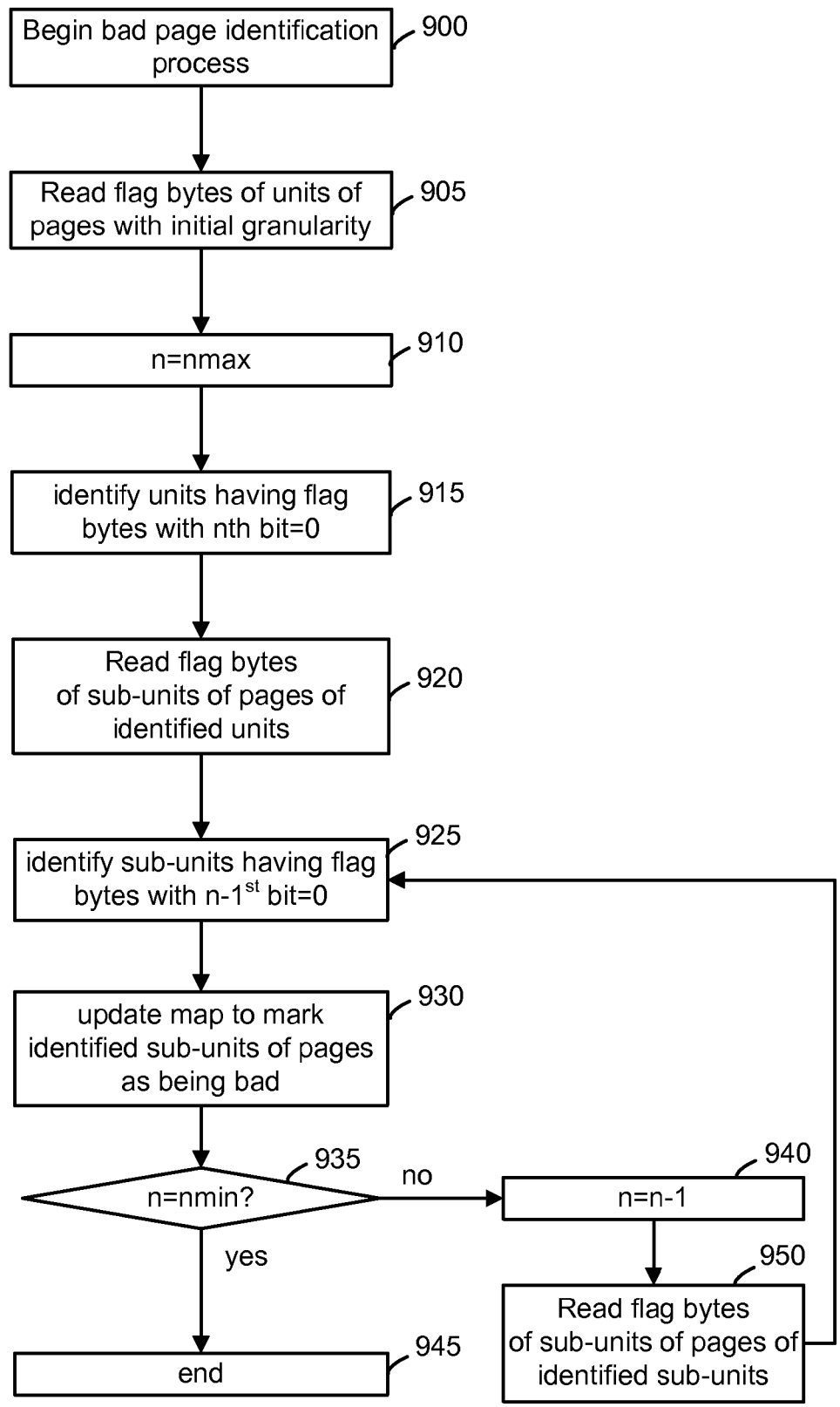
FIG. 9 depicts a process for identifying bad pages starting with an initial granularity and drilling down to finer granularities.

FIG. 9 depicts a process for identifying bad pages starting with an initial granularity and drilling down to finer granularities. This approach involves read flag bytes for higher level nodes in the hierarchy of FIG. 5, for instance, and then reading flag bytes for lower level nodes only for a higher level node which indicated that there is a fault. This process can proceed adaptively so that a selective "drill down" to lower levels of the hierarchy, e.g., less significant bits, is performed only as needed. For a node which indicates no faults, no drill down is needed. For example, in FIG. 5, the flag byte for page group(0), bit 3 (PG0B3) can be read. If the bit indicates no fault, then no drill down is performed. If PG0B3 indicates a fault, then the flag bytes for page group(0), bit 2 (PG0B2) and page group(4), bit 2 (PG4B2), are read. The memory device can be configured with the lowest level bit, nmin, which is to be examined. For example, if nmin is bit 2 (B2), the drill down process ends at PG0B2 and PG4B2. In this case, if PG0B2=0, indicating a fault in one of the associated page groups, then the page groups are marked as being bad in the map. However, if nmin is set to bit 1 (B1), the drill down process continues by examining PG0B1 and PG2B1 if PG0B2=0, and examining PG4B1 and PG6B1 if PG4B2=0.

An advantage of drilling down to lower bit levels is that fewer page groups are marked as being bad when they are not actually bad. A disadvantage is that additional processing time is used.

In FIG. 9, a bad page identification process begins at step 900. Step 905 includes reading flag bytes of units of pages with an initial granularity. The starting maximum bit position which is examined, nmax, is set at step 910. Step 915 includes identifying units having flag bytes with the nth bit=0, indicating a fault. Step 920 includes reading flag bytes of sub-units of pages of the identified units. This is the drill down to the next lower level. A sub-unit includes, e.g., a unit which is below another unit in a lower level of the hierarchy. For example, in FIG. 5, with nmax=bit 3, the initial read of step 905 might involve a flag byte which is associated with PG0B3, and the sub-unit read of step 920 might involve flag bytes which are associated with PG0B2 and PG4B2. Step 925 includes identifying the sub-units having flag bytes with the n−1$^{st}$ bit=0. This would involve identifying the sub-units having flag bytes with bit 2=0 (e.g., identifying whether PG0B2=0 and PG4B2=0. At step 930, the map is updated to mark the identified sub-units of pages as being bad.

At decision step 935, if n=nmin, that is, the lowest level of the drill down process has been reached, the process ends at step 945. At decision step 935, if n≠nmin, that is, the lowest level of the drill down process has not yet been reached, n is decremented at step 940, and the flag bytes are read of sub-units of pages of the identified sub-units at step 950. For example, if PG0B2=0, this would involve flag bytes which are associated with PG0B1 and PG2B1, and if PG4B2=0, this would involve flag bytes which are associated with PG4B1 and PG6B1. Step 925 includes identifying the sub-units having flag bytes with the n−1$^{st}$ bit=0. This would involve identifying the sub-units having flag bytes with bit 1=0 (e.g., identifying whether PG0B1=0, PG2B1=0, PG4B1=0 or PG6B1=0. At step 930, the map is again updated to mark the identified sub-units of pages as being bad. The process proceeds accordingly until the lowest drill down level is reached as determined by decision step 935.

This approach therefore avoids the need to check every page group of the memory device. Instead, the binary approach discussed collects the information about the health of each page group, allowing a quick readout of this information and also allowing the flexibility of using a bigger unit to build the map of the bad memory locations. Each page is marked as bad, if appropriate, with the use of dedicated flags. This information will be replicated on the first page of a group of sixteen pages, for instance, if any of the pages in the group is bad. This information will be again replicated on the first page of each group of sixty-four pages, for instance, if any of the internal pages is bad. In the same fashion, the information is replicated on bigger and bigger page units. In this way, the granularity of the information is still by page, but it can be accessed in a binary fashion, checking first if a big unit of pages has any bad pages internally and then checking the content of this unit with a finer granularity only if there is any bad page and only if the user has any interest in this information. One advantage is that faster readout and independence from the internally chosen granularity is achieved.

Figure 10:
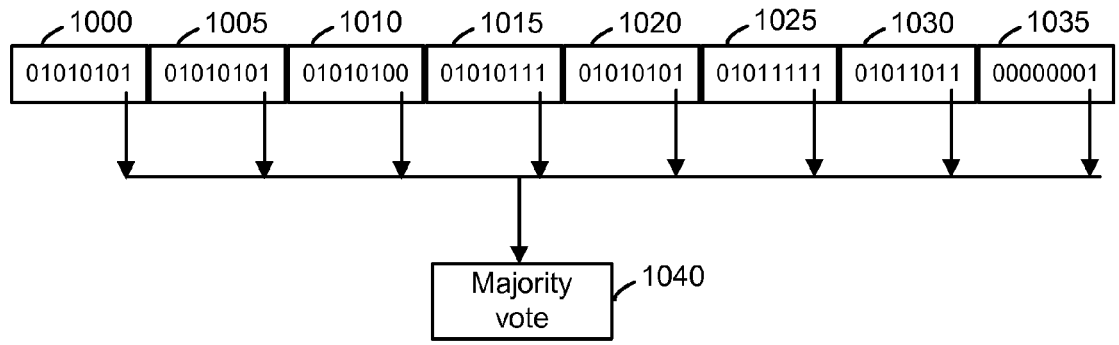
FIG. 10 depicts a majority voting process for redundant flag bytes.

FIG. 10 depicts a majority voting process for redundant flag bytes. The flag bytes of the page groups can be repeated and stored in different locations of the memory device, such as different physical word lines in different bays, e.g., as depicted by the word lines 749, 751, 752, 753, 754, 756, 757 and 758. Flag byte copies 1000, 1005, 1010, 1015, 1020, 1025, 1030 and 1035 are depicted. A value can be assigned to each bit position based on the value of the bit position in a majority of the flag bytes, in a majority vote process 1040. For example, B0=1, 1, 0, 1, 1, 1, 1 and 1 in the flag bytes 1000, 1005, 1010, 1015, 1020, 1025, 1030 and 1035, respectively. Since the value 1 occurs seven times and the value 0 occurs once, the value 1 is assigned to B0. As another example, B1=0, 0, 0, 1, 0, 1, 1 and 0 in the flag bytes 1000, 1005, 1010, 1015, 1020, 1025, 1030 and 1035, respectively. Since the value 1 occurs three times and the value 0 occurs five times, the value 0 is assigned to B1. The procedure can proceed accordingly for each bit position.

This procedure uses a type of a redundancy code and can be implemented with relatively straightforward logic so it is fast to read and write. In contrast, other error correction techniques such as those involving check bit or error correction codes are more complex and expensive to implement. A further advantage, as mentioned, is that the flag bytes can be far from each other in the memory device, such as on separate physical word lines and/or memory arrays that are connected to separate voltage driving and other peripheral circuitry. So, if one location is compromised, a valid copy of the flag byte can still be read from another location. A redundancy of eight flag bytes is an example only.

Figure 11:
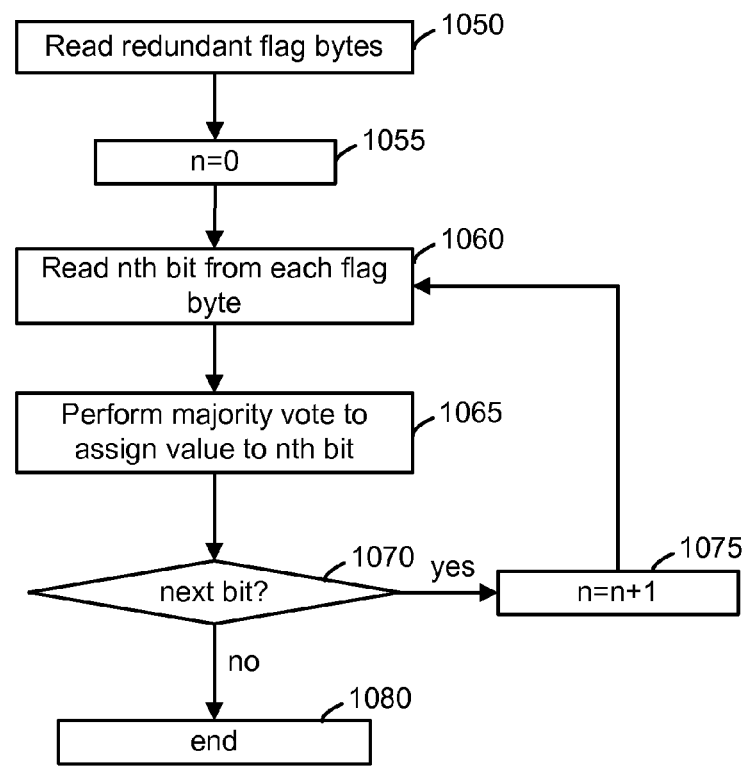
FIG. 11 depicts a process for reading flag bytes using a majority voting process.

FIG. 11 depicts a process for reading flag bytes using a majority voting process. Step 1050 includes reading the redundant flag bytes. As mentioned, for reliability, the redundant flag bytes can be stored in different memory arrays of the memory device, and/or in different physical word lines of the memory device. Step 1055 includes initializing a bit position index to 0. Step 1060 includes reading the nth bit from each flag byte. Step 1065 includes performing a majority vote to assign a value to the nth bit. If there is a next bit to analyze, at decision step 1070, the bit index is incremented at step 1075 and processing continues at step 1060. If there is not a next bit to analyze, at decision step 1070, the process ends at step 1080.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for operating a memory device which includes storage elements arranged in units, comprising:
identifying fault statuses of units of storage elements of the memory device, the units of storage elements have associated flag bytes stored in the memory device, where: (a) the fault statuses of the units are provided according to a hierarchy having at least three levels, from fault statuses for smallest units at a lowest level of the hierarchy to fault statuses for largest units at a highest level of the hierarchy, and (b) different bit positions of the flag bytes are associated with different levels of the hierarchy to indicate whether units of storage elements of the different levels include at least one faulty storage element;
the identifying comprises reading initially selected ones of the flag bytes according to an initially selected level of the hierarchy, evaluating bits of the initially selected flag bytes whose bit position corresponds to the initially selected level of the hierarchy, and, based on the evaluating, determining whether it is necessary to read additional ones of the flag bytes to identify fault statuses of the units of storage elements; and
based on the identifying, preparing a map which indicates units of storage elements of the memory device which are to be treated as being faulty.

2. The method of claim 1, wherein:
the reading comprises incrementing a read address based on a size of a unit of storage elements of the initially selected level of the hierarchy.

3. The method of claim 1, further comprising:
in response to determining from a bit of at least one of the initially selected flag bytes that a unit of storage elements of the initially selected level of the hierarchy includes at least one faulty storage element, reading additional selected ones of the flag bytes according to a first lower level of the hierarchy which is below the initially selected level, and evaluating bits of the additional selected flag bytes whose bit position corresponds to the first lower level of the hierarchy.

4. The method of claim 3, wherein:
the evaluating bits of the additional selected flag bytes identifies at least one unit of storage elements of the first lower level which includes at least one faulty storage element and at least one unit of storage elements of the first lower level which does not include at least one faulty storage element, the map does not indicate that the at least one unit of storage elements of the first lower level which does not include at least one faulty storage element is to be treated as being faulty.

5. The method of claim 4, wherein:
in response to identifying the at least one unit of storage elements of the first lower level as including at least one faulty storage element, reading further additional selected ones of the flag bytes according to a second lower level of the hierarchy which is below the first lower level, and evaluating bits of the further additional selected flag bytes whose bit position corresponds to the second lower level of the hierarchy.

6. The method of claim 5, wherein:
the evaluating bits of the further additional selected flag bytes identifies at least one unit of storage elements of the second lower level which includes at least one faulty storage element and at least one unit of storage elements of the second lower level which does not include at least one faulty storage element, the map does not indicate that the at least one unit of storage elements of the second lower level which does not include at least one faulty storage element is to be treated as being faulty.

7. The method of claim 1, wherein:
the identifying and preparing are performed by a controller of the memory device in response to the memory device being powered on, and the map is used to determine which portions of the memory device should not be used to store user data.

8. The method of claim 1, wherein:
the initially selected level of the hierarchy is set by a command received from a host controller which is external to the memory device.

9. The method of claim 1, wherein:
units of storage elements of at least two levels of the hierarchy are sub-blocks of storage elements, and a plurality of sub-blocks are in a block of storage elements.

10. The method of claim 1, wherein redundant copies of at least one of the flag bytes are stored in different locations of the memory device so that if one of the different locations of the memory device is compromised, a valid copy of the at least one of the flag bytes can still be read from another of the different locations of the memory device, the method further comprising:
determining whether a specified bit position of the redundant flag bytes should be represented by a 0 or 1 according to whether a bit of the specified bit position is a 0 or 1 more often in the redundant flag bytes.

11. A method for operating a memory device which includes storage elements arranged in units, comprising:

identifying fault statuses of units of storage elements of the memory device, the units of storage elements have associated flag bytes stored in the memory device, redundant copies of at least one of the flag bytes are stored in different locations of the memory device so that if one of the different locations of the memory device is compromised, a valid copy of the at least one of the flag byte flag bytes can still be read from another of the different locations of the memory device, where each selected redundant flag byte has a bit which indicates whether an associated unit of storage elements includes at least one faulty storage element, at least two of the selected redundant flag bytes are stored in different memory arrays of the memory device;

the identifying comprises reading the selected redundant flag bytes, and determining whether the associated unit of storage elements includes at least one faulty storage element by determining whether a bit in a specified bit position of the selected redundant flag bytes is a 0 or 1 more often in the redundant flag bytes; and based on the identifying, preparing a map which indicates units of storage elements of the memory device which are to be treated as being faulty.

12. The method of claim 11, wherein:

at least two of the selected redundant flag bytes are stored in different physical word lines of the memory device.

13. The method of claim 11, wherein:

the fault statuses of the units of storage elements are provided according to a hierarchy having at least three levels, from fault statuses for smallest units at a lowest level of the hierarchy to fault statuses for largest units at a highest level of the hierarchy; and each selected redundant flag byte has a bit which indicates whether an associated unit of storage elements includes at least one faulty storage element, for each level of the hierarchy.

14. A method for operating a memory device which includes storage elements arranged in units, comprising:

testing units of storage elements to identify units which include at least one faulty storage element; and based on the testing, writing flag bytes to the memory device, the flag bytes indicate fault statuses of the of storage elements, where: (a) the fault statuses are provided according to a hierarchy having at least three levels, from fault statuses for smallest units at a lowest level of the hierarchy to fault statuses for largest units at a highest level of the hierarchy, and (b) different bit positions of the flag bytes are associated with different levels of the hierarchy to indicate whether units of storage elements of the different levels include at least one faulty storage element.

15. The method of claim 14, further comprising:

configuring the memory device to initially read selected ones of the flag bytes with a specified granularity such that the flag bytes are read by incrementing a read address according to the specified granularity, and to subsequently read other ones of the flag bytes with a finer granularity, if the step of initially reading identifies a fault in at least one of the units of storage elements.

16. The method of claim 14, wherein:

the writing comprises writing redundant copies of flag bytes to the memory device, at least two of the redundant copies of flag bytes are stored in different memory arrays of the memory device.

17. The method of claim 14, wherein:

units of storage elements of at least two levels of the hierarchy are sub-blocks of storage elements, and a plurality of sub-blocks are in a block of storage elements.

18. A system which performs the method of claim 1.

19. A method for building a map of bad memory locations in a memory device which includes storage elements arranged in units, including at least first, second, third and fourth units, comprising:

reading a flag byte of the first unit, different bit positions of the flag byte of the first unit are arranged according to a hierarchy of the units, including: (a) a bit position which indicates a fault status of the first unit, but not the second, third and fourth units, (b) a bit position which indicates a fault status of a set comprising the first and second units but not the third and fourth units, and (c) a bit position which indicates a fault status of a set comprising the first, second, third and fourth units;

the reading comprises reading the bit position which indicates the fault status of the set comprising the first, second, third and fourth units; and if no fault is indicated by the bit position which indicates the fault status of the set comprising the first, second, third and fourth units: updating the map of bad memory locations to indicate that there is no fault in each of the first, second, third and fourth units, without reading flag bytes of the second, third and fourth units.

20. The method of claim 19, further comprising:

if a fault is indicated by the bit position which indicates the fault status of the set comprising the first, second, third and fourth units: reading, in the flag byte of the first unit, the bit position which indicates the fault status of the set comprising the first and second units but not the third and fourth units; and if no fault is indicated by the bit position which indicates the fault status of the set comprising the first and second units but not the third and fourth units: updating the map of bad memory locations to indicate that there is no fault in each of the first and second units, without reading the flag byte of the second unit.

21. The method of claim 19, further comprising:

if a fault is indicated by the bit position which indicates the fault status of the set comprising the first, second, third and fourth units:

reading, in the flag byte of the first unit, the bit position which indicates the fault status of the set comprising the first and second units but not the third and fourth units; and reading, in the flag byte of the third unit, a bit position which indicates a fault status of a set comprising the third and fourth units but not the first and second units.

22. The method of claim 21, further comprising:

if no fault is indicated by the bit position which indicates the fault status of the set comprising the first and second units but not the third and fourth units: updating the map of bad memory locations to indicate that there is no fault in each of the first and second units, without reading the flag byte of the second unit; and if no fault is indicated by the bit position which indicates the fault status of the set comprising the third and fourth units but not the first and second units: updating the map of bad memory locations to indicate that there is no fault in each of the third and fourth units, without reading the flag byte of the fourth unit.

23. The method of claim 21, further comprising:
if a fault is indicated by the bit position which indicates the fault status of the set comprising the first and second units but not the third and fourth units:
reading, in the flag byte of the first unit, the bit position which indicates the fault status of the first unit, but not the second, third and fourth units; and
reading, in the flag byte of the second unit, a bit position which indicates the fault status of the second unit, but not the first, third and fourth units.

24. A system which performs the method of claim 19.

* * * * *